United States Patent [19]  [11] 4,115,798
Platzoeder  [45] Sep. 19, 1978

[54] SEMICONDUCTOR COMPONENT HAVING PATTERNED RECOMBINATION CENTER MEANS WITH DIFFERENT MEAN VALUE OF RECOMBINATION CENTERS ON ANODE SIDE FROM THAT ON CATHODE SIDE

[75] Inventor: Karl Platzoeder, Haimhausen, Germany

[73] Assignee: Siemens Aktiengesellschaft, Berlin & Munich, Germany

[21] Appl. No.: 802,816

[22] Filed: Jun. 2, 1977

[30] Foreign Application Priority Data

Jun. 9, 1976 [DE] Fed. Rep. of Germany ....... 2625856

[51] Int. Cl.² .......................................... H01L 29/167
[52] U.S. Cl. ......................................... 357/64; 357/38; 357/90
[58] Field of Search ................... 357/20, 38, 64, 91, 357/90

[56] References Cited
U.S. PATENT DOCUMENTS

| 3,317,359 | 5/1967 | Engbert | 357/64 |
| 3,419,764 | 12/1968 | Kasugai et al. | 357/64 |
| 3,440,113 | 4/1969 | Wolley | 357/38 |
| 3,625,781 | 12/1971 | Joshi et al. | 357/64 |
| 3,988,771 | 10/1976 | Krishna | 357/64 |
| 3,990,091 | 11/1976 | Cresswell et al. | 357/90 |
| 4,031,607 | 6/1977 | Cline et al. | 357/64 |

Primary Examiner—Joseph E. Clawson, Jr.
Attorney, Agent, or Firm—Hill, Gross, Simpson, Van Santen, Steadman, Chiara & Simpson

[57] ABSTRACT

A semiconductor component having a semiconductor body having at least two zones of alternate opposite conductivity type in which the concentration of introduced recombination centers is varied between the anode side and the cathode side in such a way that the profile of the recombination centers is not symmetrical. A thyristor is disclosed in which at least the outer anode-side region of the central zone is divided into surface elements having differing levels of concentration of recombination centers, and in which the ratio of the surface elements is set to be such that in the central region the mean value of the concentration of the recombination centers is higher than the cathode-side mean value. Gettering layers are provided which produce this result. Surface elements are provided in the semiconductor body which alter the concentration of recombination centers. The ratio of the areas of the surface elements having a high concentration to those having a low concentration should lie between 0.9:0.1 and 0.1:0.9. The maximum distance between surface elements having a low concentration preferably should be less than the thickness of the semiconductor body.

8 Claims, 5 Drawing Figures

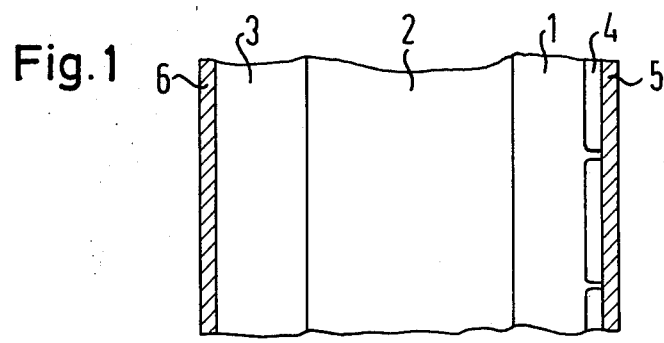
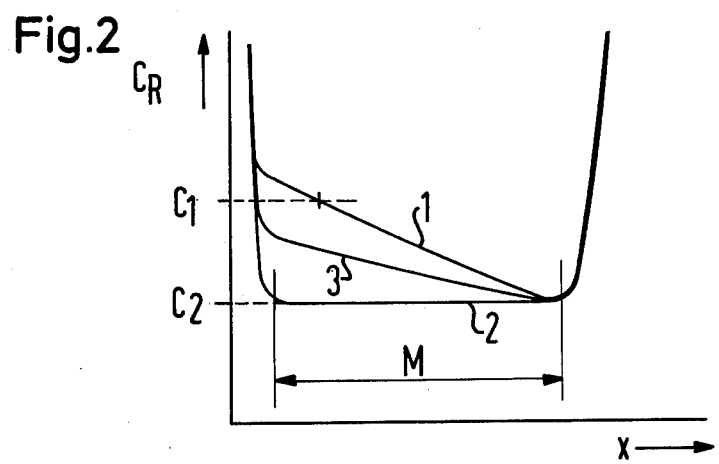
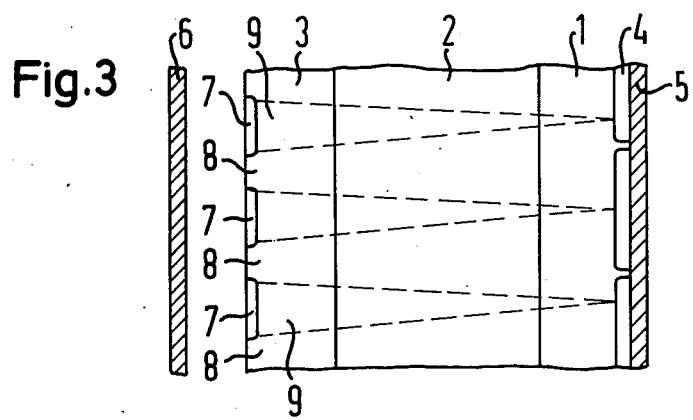

SEMICONDUCTOR COMPONENT HAVING PATTERNED RECOMBINATION CENTER MEANS WITH DIFFERENT MEAN VALUE OF RECOMBINATION CENTERS ON ANODE SIDE FROM THAT ON CATHODE SIDE

INTRODUCTION

The present invention relates to a semiconductor component with a semiconductor body having at least two zones of alternate opposite conductivity type, whose outer, anode-side zone is connected on its entire surface to an anode electrode, the semiconductor body having recombination centers therein, and with at least one layer, which serves to getter the recombination centers, in a zone thereof, and where a drop in the concentration of the recombination centers occurs towards a central zone.

BACKGROUND OF THE INVENTION

Semiconductor components of this type, be they thyristors or diodes, for example, are generally known. The semiconductor body of a thyristor generally possesses four zones of alternate opposite conductivity type, and a pn-junction in each case lies between these zones. The pn-junction located between the outer and the inner anode-side zone is referred to as a blocking-pn-junction, since the greatest part of the blocking voltage occurs across it. The semiconductor body of a power diode basically possesses two zones of opposite conductivity type. The semiconductor bodies of such semiconductor components generally possess a specific content of recombination centers, which decisively influence their electric properties, for example the turn-off time. The aforementioned recombination centers are generally heavy metal atoms, such as gold, platinum or manganese.

The processes which are employed in the production of the above-mentioned semiconductor components involve the gettering of a specific part of the introduced recombination centers into regions close to the surface. The gettering layers are, for example, highly doped zones, in particular zones doped with boron or phosphorus, or also zones close to the surface, whose crystal lattice structure is heavily disturbed by mechanical processing. As a result of the gettering, there is a reduction in the concentration of the recombination centers beneath the gettering layer close to the surface. If uniformly gettered layers are present both at the anode side and at the cathode side, the curve of the concentration of the recombination centers over the thickness of the semiconductor body has a U-shaped, symmetrical profile. If, on the other hand, a weaker gettering effect exists at the anode side than at the cathode side, for example, due to less disturbance of the surface, the concentration of the recombination centers is higher at the anode side than at the cathode side.

The absolute degree of the concentration of the recombination centers can be set by the quantity of the diffused-in recombination centers, for example, of gold atoms. The symmetry of the profile of the concentration of the recombination centers cannot in practice be effectively influenced either by controlling the quantity of the recombination centers or by controlling the diffusion parameters during the diffusing-in of the recombination centers.

BRIEF SUMMARY OF THE INVENTION

For many purposes of use, it is desirable to eliminate the above referred to symmetry, and to set a determinate gradient of the concentration of the recombination centers in the central zone. As the term "central zone" is herein used, it is to be understood as that zone in the semiconductor body which lies between the two flanks of the U-shaped profile.

The concentration of recombination centers at the blocking-pn-junction of a thyristor and at the pn-junction of a diode fundamentally determines, for example, the reverse-current characteristics of a semiconductor component of this type. By selecting the gradient of the concentration of the recombination centers in the central zone it is possible to produce semiconductor components which with a given drop in forward current, have either a shorter turn-off time or a more favorable reverse current characteristic than components having a symmetrical profile of the concentration of the recombination centers.

It is an object of the present invention to provide a semiconductor component of this type in which a gradient of the concentration of the recombination centers can be set in determinate fashion, and particularly in such a way that the concentration in the central zone is higher at the anode side than at the cathode side.

It is a further object of this invention to provide a thyristor or a diode in which at least the outer anode-side region of the central zone is divided into surface elements having differing levels of concentration of recombination centers, and in which the ratio of the surface elements is set to be such that in the central region the mean value of the concentration of the recombination centers is higher than the cathode-side mean value.

In this way, the desired gradient of the average concentration of the recombination centers in the central region can be set in a determinate fashion simply by selecting the size of the surface elements.

The surface elements can preferably form a regular pattern. Advantageously, the surface elements having a comparatively high concentration form a network pattern. However, the surface elements having a low concentration can also form a network pattern. The ratio of the areas of the surface elements having a high concentration to those having a low concentration should lie between 0.9:0.1 and 0.1:0.9. The maximum distance between surface elements having a low concentration preferably should be less than the thickness of the semiconductor body.

BRIEF DESCRIPTION OF THE DRAWINGS

The invention will be explained in detail making reference to exemplary embodiments, in association with FIGS. 1 to 5, in which:

FIG. 1 is a partial sectional view through a part of a semiconductor body of a thyristor;

FIG. 2 is a diagram which illustrates the concentration of the recombination centers $C_R$ over the thickness $x$ of the semiconductor body;

FIG. 3 is a diagrammatic sectional view through a part of the semiconductor body of a thyristor in accordance with the invention prior to the application of the anode-side electrode;

DESCRIPTION OF THE PREFERRED EMBODIMENTS

Figure 4:
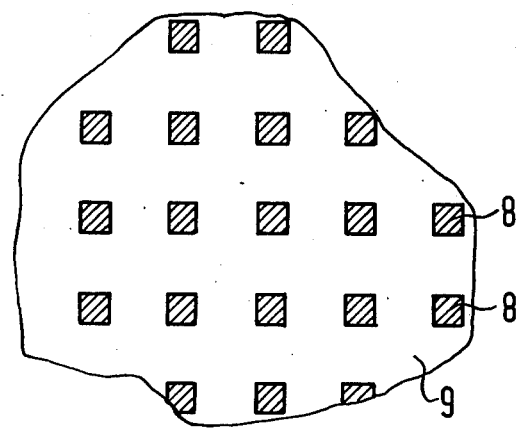
FIG. 4 is an anode-side view of a portion of a semiconductor body in accordance with a first exemplary embodiment.

The semiconductor body shown in FIG. 1 possesses four zones 1, 2, 3, 4, of alternate conductivity type. The conductivity type, by way of illustration, commencing from zone 4, is to be npnp. The cathode-side outer zone 4 and the anode-side outer zone 3 act as emitters and the zones 1, 2, which adjoin these outer zones act as bases. The zone 4 is provided with openings (not marked in detail) in order to improve the *du/dt* behavior, and is covered with and electrically connected thereto. The anode-side outer zone 3 is covered on the whole of its surface with an anode electrode 6 and is electrically connected to the latter. Recombination centers, for example gold, have been diffused into the semiconductor body. As a result of the normally high doping of the outer zone 4, the gold atoms are strongly gettered in the cathode-side outer layer, so that a considerable drop in the gold concentration occurs on the cathode side, from the exterior. Here the dopants of the zone 4, in the present case phosphorus, for example, act as a getter. On the outside of the anode-side zone 3, the gettering action is generally weaker, so that the concentration of recombination centers possess the characteristics of the curve 1 illustrated in FIG. 2. It can clearly be seen that the gold concentration $C_1$ is relatively high at the pn-junction between the zones 2 and 3 — the blocking pn junction. The central region of the concentration profile of the recombination centers is referenced M in FIG. 2. It basically lies between the cathode-side and anode-side and there is an abrupt drop in the gold concentration across the central region.

If gettering layers of equal thickness are provided both on the outside of the zone 3 and on the outside of the cathode, the gold concentration curve referenced 2 occurs, with the concentration $C_2$ at the blocking pn-junction. Intermediate values of the gradient of the average concentration of the recombination centers in the central region could not previously be set in a simple and reproducible fashion.

The concentration curves illustrated in FIG. 2 can also occur in the case of the semiconductor body of a diode. The semiconductor body of a diode differs from that of a thyristor basically merely in that it does not contain the zone 4, and the zone 1 has the same conductivity type as the zone 2. Then the pn-junction of the diode lies between the zones 2 and 3.

The semiconductor body shown in FIG. 3 has been provided with the same references as in FIG. 1. This is also a semiconductor body of a thyristor. In accordance with the invention, at least the outer, anode-side zone 3 is divided into surface elements with differing levels of concentration of the recombination centers. The surface elements having high concentration are referenced 8, and the surface elements having a low concentration are referenced 9. The surface elements 8, 9 possess determinate areas, the size ratio of which determines the gradient of the mean value of the concentration, i.e., the desired concentration value to be set, of the recombination centers at and in the vicinity of the blocking pn-junction between the zones 2 and 3. The zones of relatively high concentration diverge towards the inside of the semiconductor body, so that in particular and approximately homogeneous lateral distribution of the recombination centers occur at the pn-junction between zones 1 and 2, when the distance of the zone 9 is small relative to the thickness of the semiconductor body.

A noticeable change in the gradient relative to curves 1, 2 (FIG. 2) is obtained if the ratio of the areas of the regions 8, 9 lies between 0.1 : 0.9 and 0.9 : 0.1. If the ratio of the surface elements is approximately 0.9 : 0.1, a gradient which is somewhat lower than the curve 1 in FIG. 2 occurs at the blocking pn-junction. With a reducing ratio of the areas of the surface elements, the gradient of the concentration of the recombination centers at the blocking pn-junction becomes increasinly smaller. With an area ratio of approximately 0.1 : 0.9, the gradient is somewhat greater than in the case of the curve 2 in FIG. 2. Thus, by a suitable selection of the ratio of the areas, it is possible in a simple and reproducible fashion to set a desired gradient of the concentration of recombination centers at the blocking pn-junction and at the pn-junction of the diode. This gradient is represented by the curve 3 in FIG. 2, for example.

The surface elements of comparatively low concentration can be produced, for example, by gettering layers which are arranged at the anode side and whose areas possess the above mentioned ratio to the surfaces not covered by gettering layers, i.e., between 0.1 : 0.9 and 0.9 : 0.1. These gettering layers referenced 7 in FIG. 3, can be produced, for example, by layers which are formed in a known manner, and are highly doped (a few $10^{19}$ to a few $10^{21}$ atoms/cm$^3$) with phosphorus or boron, or also by layers having a heavily disturbed crystal surface. Heavily disturbed surfaces are obtained, for example, by sand blasting. The surface elements are produced using suitable, known masks. It is sufficient for the zones 7 to possess a thickness of a few tenths to a few $\mu$m.

The zones 7 disappear if the anode-side electrode 6 is alloyed-on following the production of the gettering layers and the diffusing-in of the recombination centers. The alloying is normally carried out with aluminum, i.e., a strongly p-doping material. In this way if the zones 7 are already highly doped by phosphorus or boron, they become over-doped. If the zones 7 are not over-doped by alloying, they can be removed, for example, by etching after the introduction of the recombination centers and before the contacting.

Figure 5:
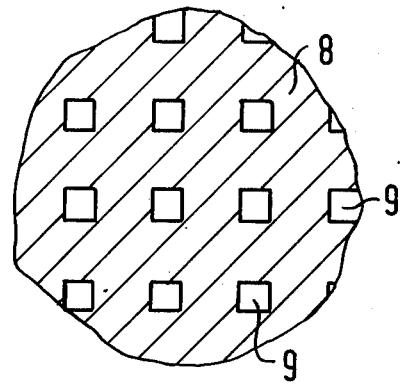
FIG. 5 is the anode-side view of a portion of a semiconductor body corresponding to a second exemplary embodiment of the invention.

FIGS. 4 and 5 show two practical examples of dividing the anode-side zone 3 of the semiconductor body into zones of high and comparatively low concentration of the recombination centers. FIGS. 4 and 5 show portions of the semiconductor body. In FIG. 4, the surface elements 9 having a low concentration are arranged as recesses in a zone 8 of high concentration. The zone 8 forms a network pattern. However, the surface elements 9 can also lie for example on concentric rings. FIG. 5 illustrates the reverse situation, in which the surface elements 9 form a network pattern which includes the surface elements 9. The surface elements and the zone 8 are shaded for emphasis.

In FIGS. 4 and 5, a relatively coarse pattern has been shown for clarity. In order to keep low fluctuations in the mean value toward the cathode side, a finer pattern with small areas is preferred. For example, it has proved valuable to divide the anode side into surface elements each having an edge length of 150 $\mu$m. In the case of the network pattern, this results in intersecting lines of 150 $\mu$m width enclosing windows of 150 $\mu$m edge length between them.

The difference in concentration of the gold doping of both types of surface element amounts to 2 : 1 for example in the central region. If the area ratios are varied within the above mentioned limits, clear changes in the gradient of the concentration of recombination centers occur in the central region and in the reverse-current characteristic. Thus, for example, in the case of thyristors having high reverse voltage rating and having identical reverse- and forward properties, and in which the areas possess a ratio of 0.5 : 0.5, a 20% reduction in storage charge, which is responsible for the reverse current characteristic, is achieved in comparison to a thyristor having a symmetrical profile of the doping concentration of the recombination centers.

It will be apparent to those skilled in the art that many modifications and variations may be effected without departing from the spirit and scope of the novel concepts of the present invention.

I claim as my invention:

1. A semiconductor component comprising a semiconductor body having at least two zones of alternate opposite conductivity type, the outer anode-side zone being connected on its entire surface with an anode electrode, said semiconductor body having recombination centers therein with means for gettering the recombination centers on the outer, cathode-side zone, where at the anode-side and at the cathode-side a drop occurs in the concentration of the recombination centers toward a central region, at least the outer, anode-side region of the said central region being divided into surface elements having different levels of concentration of recombination centers, and the ratio of the surface elements being such that in the central region the anode-side mean value of the concentration of the recombination centers is higher than the cathode-side mean value.

2. A semiconductor component as claimed in claim 1, in which the surface elements form a regular pattern.

3. A semiconductor component as claimed in claim 1, in which the surface elements having a comparatively high concentration form a network pattern.

4. A semiconductor component as claimed in claim 1, in which the surface elements having a comparatively low concentration form a network pattern.

5. A semiconductor component as claimed in claim 1, in which the ratio of the areas of the surface elements having a high concentration to those having a low concentration lies between 0.9 : 0.1 and 0.1 : 0.9.

6. A semiconductor component as claimed in claim 1, in which the maximum distance between surface elements having a low concentration is less than the thickness of the semiconductor body.

7. A semiconductor component with a semiconductor body having an outer anode-side zone, an outer cathode-side zone, and a blocking P-N junction, said body having a specific content of recombination centers therein, the outer anode-side zone being divided into surface elements with two different levels of concentration of recombination centers, said surface elements possessing determinate areas the size of which determine the gradient of the mean value of concentration in the vicinity of the blocking-pn-junction of said body, the ratio of the areas of said two different levels of recombination centers being between 0.1:0.9 and 0.9:0.1.

8. A semiconductor component with a semiconductor body having an outer cathode-side zone and an outer anode-side zone, said body having a specific content of recombination centers therein, the concentration of said recombination centers being distributed to have a U-shaped profile across said body, said profile defining a central region lying between an anode-side and a cathode-side drop of the concentration of the recombination centers, means for gettering a portion of said recombination centers to produce a non-symmetrical U-shaped profile, at least an outer anode-side region of the central region of said semiconductor body being divided into surface elements having different levels of concentration of recombination centers in which the ratio of said surface elements is such that the central region of said body has an anode-side means value of concentration of the recombination centers which is higher than the cathode-side mean value.

* * * * *